US012770690B2

(12) United States Patent
Wang et al.

(10) Patent No.: US 12,770,690 B2
(45) Date of Patent: Oct. 20, 2026

(54) MANAGING PROGRAM OPERATIONS IN MEMORY DEVICES

(71) Applicant: Yangtze Memory Technologies Co., Ltd., Wuhan (CN)

(72) Inventors: Tingze Wang, Wuhan (CN); Ying Huang, Wuhan (CN); Hongtao Liu, Wuhan (CN); Pengyu Xu, Wuhan (CN); Xiangnan Zhao, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 99 days.

(21) Appl. No.: 18/932,991

(22) Filed: Oct. 31, 2024

(65) Prior Publication Data

US 2026/0105964 A1 Apr. 16, 2026

(30) Foreign Application Priority Data

Oct. 10, 2024 (CN) ......................... 202411411699.0

(51) Int. Cl.
*G11C 16/10* (2006.01)
*G11C 16/04* (2006.01)

(52) U.S. Cl.
CPC ........ *G11C 16/102* (2013.01); *G11C 16/0483* (2013.01)

(58) Field of Classification Search
CPC .............. G11C 16/102; G11C 16/0483; G11C 11/5628; G11C 16/08; G11C 16/3427; G11C 16/10
USPC ...................................... 365/189.011, 185.24
See application file for complete search history.

(56) References Cited

U.S. PATENT DOCUMENTS

| | | | | |
|---|---|---|---|---|
| 8,923,054 B1 * | 12/2014 | Costa | G11C 16/16 | 365/185.11 |
| 12,147,340 B2 * | 11/2024 | Yoon | G11C 11/5628 | |
| 2023/0038237 A1 * | 2/2023 | Lee | G11C 16/08 | |
| 2023/0100548 A1 * | 3/2023 | Ko | G11C 11/5628 | 365/185.18 |
| 2023/0290412 A1 * | 9/2023 | Choi | G11C 16/10 | |
| 2023/0343400 A1 * | 10/2023 | Guo | G11C 11/5628 | |
| 2024/0112743 A1 * | 4/2024 | Zhang | G11C 16/0483 | |
| 2024/0161834 A1 * | 5/2024 | Heo | G11C 16/0483 | |

* cited by examiner

*Primary Examiner* — Michael T Tran
(74) *Attorney, Agent, or Firm* — Fish & Richardson P.C.

(57) ABSTRACT

Methods, devices, and systems for managing memory devices are provided. In one aspect, a memory device includes a memory array including a memory block, and a peripheral circuit coupled to the memory array. The memory block includes a set of strings. The peripheral circuit is configured to program the memory block. Programming the memory block includes, after programming a first string of the set of strings, programming a second string and a third string of the set of strings. The first string is between the second string and the third string.

19 Claims, 14 Drawing Sheets

MANAGING PROGRAM OPERATIONS IN MEMORY DEVICES

CROSS-REFERENCE TO RELATED APPLICATIONS

This application claims priority to Chinese Patent Application No. 202411411699.0, filed on Oct. 10, 2024, which is hereby incorporated by reference in its entirety.

TECHNICAL FIELD

The present disclosure generally relates to memory devices and memory systems, and in particular, to managing program operations in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the memory block level, a program operation can be performed at the page level, and a read operation can be performed at the page level.

SUMMARY

The present disclosure involves methods, apparatuses, and systems for managing program operations in memory devices. One aspect of the present disclosure features an example memory device that includes a memory array including a memory block, and a peripheral circuit coupled to the memory array. The memory block includes a set of strings. The peripheral circuit is configured to program the memory block. Programming the memory block includes, after programming a first string of the set of strings, programming a second string and a third string of the set of strings. The first string is between the second string and the third string.

In some implementations, the set of strings include N strings numbered in sequence from a first boundary of the memory block to a second boundary of the memory block. Programming the memory block includes the following operations in sequence: programming the $$\left(\frac{N}{2}\right)^{th}$$

string; programming the $$\left(\frac{N}{2}+1\right)^{th}$$

string; and programming the $$\left(\frac{N}{2}-1\right)^{th}$$

string, where N is an even number.

In some implementations, the set of strings include N strings numbered in sequence from a first boundary of the memory block to a second boundary of the memory block. Programming the memory block includes the following operations in sequence: programming the $$\left(\frac{N+1}{2}\right)^{th}$$

string; programming the $$\left(\frac{N+1}{2}+1\right)^{th}$$

string; and programming the $$\left(\frac{N-1}{2}\right)^{th}$$

string, where N is an odd number.

In some implementations, channel structures of the first string are larger in size than channel structures of the second string and the third string.

In some implementations, after programming the second string and the third string, a read window of the first string is narrower than a read window of the second string or the third string.

In some implementations, the memory block includes a first finger, a second finger, and a third finger each including one or more strings of the set of strings. The second finger is between the first finger and the third finger. The second finger includes the first string, the second string, and the third string.

In some implementations, the first finger includes a fourth string, a fifth string, and a sixth string that is between the fourth string and the fifth string. The third finger includes a seventh string, an eighth string, and a ninth string that is between the seventh string and the eighth string. Programming the memory block includes programming the sixth string after programming the first string, and programming the ninth string after programming the sixth string and before programming the second string.

In some implementations, the first finger includes a fourth string, a fifth string and a sixth string that is between the fourth string and the fifth string. The third finger includes a seventh string, an eighth string and a ninth string that is between the seventh string and the eighth string. Programming the memory block includes programming the sixth string, programming the fourth string and the fifth string after programming the sixth string and before programming the first string, programming the ninth string after programming the second string and the third string; and programming the seventh string and the eighth string after programming the ninth string.

In some implementations, each of the set of strings includes more than one row of channel structures. The set of strings are separated from each other by drain select gate (DSG) cuts.

In some implementations, a DSG cut is arranged on a row of channel structures.

In some implementations, a DSG cut is arranged between two rows of channel structures.

In some implementations, the memory device includes a NAND memory device. The memory array includes memory cells stacked in three dimensions.

Another aspect of the present disclosure features a method of operating a memory device. The method includes programming a memory block including a set of strings. Programming the memory block includes, after programming a first string of the set of strings, programming a second string and a third string of the set of strings. The first string is arranged between the second string and the third string.

In some implementations, the set of strings include N strings numbered in sequence from a first boundary of the memory block to a second boundary of the memory block. Programming the memory block includes the following operations in sequence: programming the $$\left(\frac{N}{2}\right)^{th}$$

string; programming the $$\left(\frac{N}{2}+1\right)^{th}$$

string; and programming the $$\left(\frac{N}{2}-1\right)^{th}$$

string, where N is an even number.

In some implementations, the set of strings include N strings numbered in sequence from a first boundary of the memory block to a second boundary of the memory block. Programming the memory block includes the following operations in sequence: programming the $$\left(\frac{N+1}{2}\right)^{th}$$

string; programming the $$\left(\frac{N+1}{2}+1\right)^{th}$$

string; and programming the $$\left(\frac{N-1}{2}\right)^{th}$$

string, where N is an odd number.

In some implementations, the memory block includes a first finger, a second finger and a third finger each including one or more strings of the set of strings. The second finger is between the first finger and the third finger. The second finger includes the first string, the second string and the third string.

In some implementations, the first finger includes a fourth string, a fifth string, and a sixth string that is between the fourth string and the fifth string. The third finger includes a seventh string, an eighth string, and a ninth string that is between the seventh string and the eighth string. Programming the memory block includes programming the sixth string after programming the first string, and programming the ninth string after programming the sixth string and before programming the second string.

In some implementations, the first finger includes a fourth string, a fifth string and a sixth string that is between the fourth string and the fifth string. The third finger includes a seventh string, an eighth string and a ninth string that is between the seventh string and the eighth string. Programming the memory block includes programming the sixth string, programming the fourth string and the fifth string after programming the sixth string and before programming the first string, programming the ninth string after programming the second string and the third string; and programming the seventh string and the eighth string after programming the ninth string.

In some implementations, each of the set of strings includes more than one row of channel structures. The set of strings are separated from each other by drain select gate (DSG) cuts.

Another aspect of the present disclosure features a memory system. The memory system includes a memory device and a memory controller coupled to the memory device and configured to control the memory device. The memory device includes a memory array including a memory block that includes a set of strings, and a peripheral circuit coupled to the memory array. The peripheral circuit is configured to program the memory block. Programming the memory block includes, after programming a first string of the set of strings, programming a second string and a third string of the set of strings. The first string is between the second string and the third string.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

This specification relates to memory devices, memory systems, and methods for managing program time in flash memory. In some cases, a memory block of a memory device (e.g., a NAND flash memory) can include a set of strings. Due to fabrication processes, strings in the same block can have different levels of quality (or performances). For example, a string closer to the boundaries of the memory block can have lower quality than a string further away from the boundaries of the memory block. A string of lower quality can have a narrower read window than a string of higher quality.

When programming the memory block including the set of strings, a string that is programmed earlier can be affected more by program disturbance than a string that is programmed later. As such, the string that is programmed earlier can have a narrower read window than a string that is programmed later.

In some cases, when programming the memory block, the set of strings are programmed in a sequence from a first boundary of the memory block to a second boundary of the memory block, such that an outer string (e.g., a string that is closest to either boundary of the memory block and is of the lowest quality) is programmed first. Combining the effects from fabrication processes and from program disturbance, the read window of the outer string can be substantially narrower than the read window of an inner string (e.g., a string that is furthest away from the boundaries of the memory block and is of the highest quality), which may decrease the reliability of the memory device.

The present disclosure provides techniques to program a memory block including a set of strings, so that the set of strings can have more uniform read windows. In some implementations, when programming the memory block, the set of strings are programmed in a sequence from the inner string to the outer string, so that the inner string is programmed first. As such, by balancing the effects from fabrication processes and from program disturbance, the difference between the read window of the outer string and the read window of the inner string can be reduced. The quality of the worst string in the memory block can be improved.

The described techniques can achieve one or more technical effects. For example, the set of strings of the memory block can have more uniform read windows, which can increase the reliability of the memory device. For another example, the described techniques do not require changing the fabrication process of the memory device and can improve the reliability of the memory device in a cost-efficient way. In some implementations, additional or different technical effects can be achieved.

Figure 1:
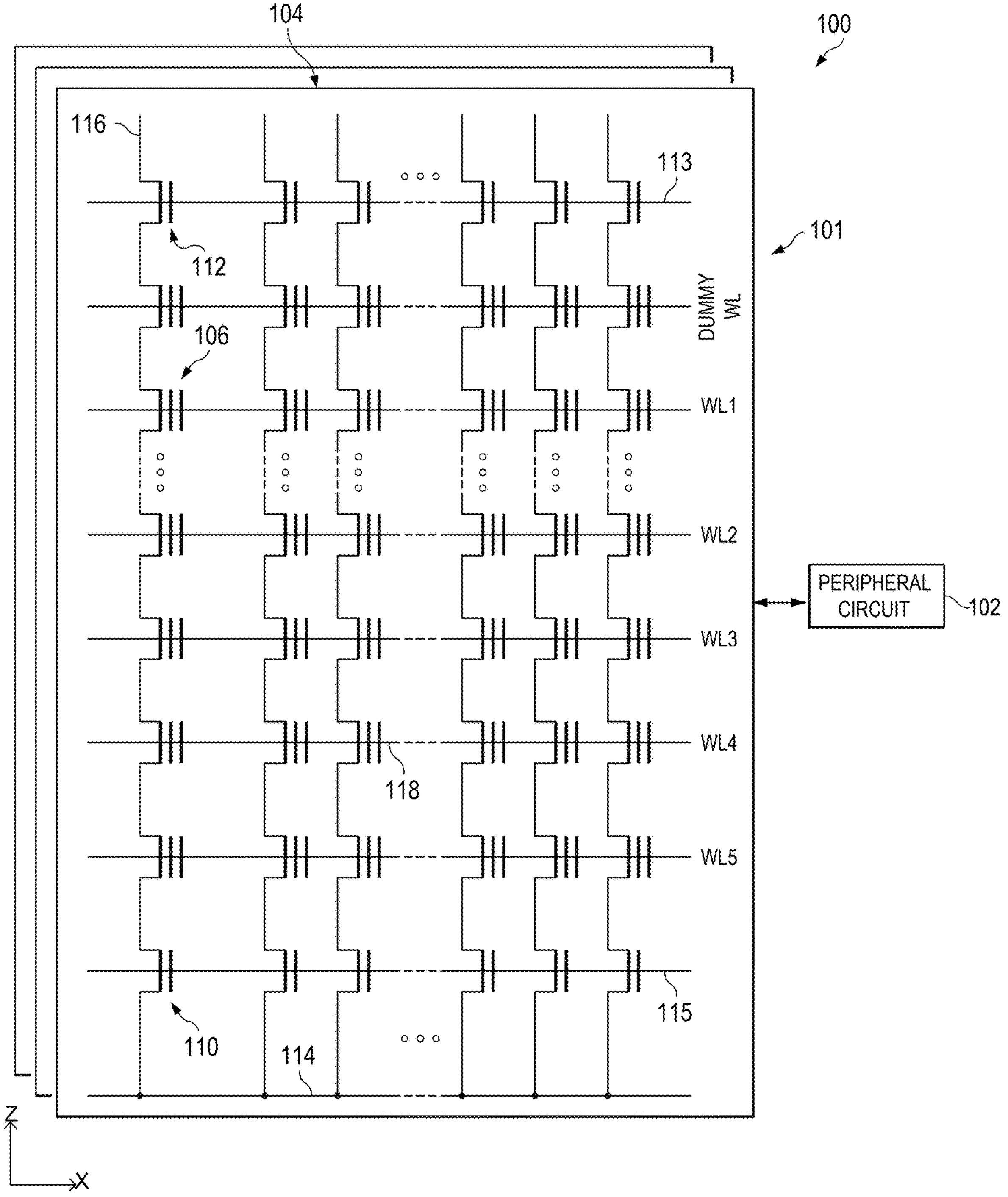
FIG. 1 illustrates an example of a schematic diagram of a memory device including peripheral circuits, according to some aspects of the present disclosure.

FIG. 1 illustrates an example of a schematic circuit diagram of a memory device 100 including peripheral circuits, according to some aspects of the present disclosure. The memory device 100 can include a memory array 101 and peripheral circuits 102 coupled to the memory array 101. The memory array 101 can be a NAND flash memory array that includes NAND memory cells 106 arranged in rows and columns. In some implementations, memory cells 106 in a column (e.g., along z direction) of the memory array 101 are coupled in series and stacked vertically. Memory cells 106 in a row (e.g., along x direction) of the memory array 101 are coupled to and controlled by a word line 118. Each memory cell 106 can hold a continuous, analog value, such as an electrical voltage or charge that depends on the number of electrons trapped within a storage layer of the memory cell 106. The logic state (i.e., data) of each memory cell 106 can be determined based on the threshold voltage $V_{th}$ of the memory cell 106. Each memory cell 106 can be a floating gate type memory cell including a floating-gate transistor, or a charge trap type memory cell including a charge-trap transistor.

In some implementations, each memory cell 106 is a single-level cell (SLC) with two possible memory states that can store one bit of data. For example, the first memory state "0" (e.g., erased state) can correspond to a first range of voltages, and the second memory state "1" (e.g., programmed state) can correspond to a second range of voltages. In some implementations, to increase storage capacity, each memory cell 106 can a multi-level cell (MLC), a triple-level cell (TLC), or a quad-level cell (QLC). An MLC stores 2 bits of data, and has four logic states, logic {11, 10, 01, and 00}, i.e., erased state, and programmed states P1, P2, and P3. A TLC stores 3 bits of data, and has eight logic states, logic {111, 110, 101, 100, 011, 010, 001, 000}, i.e., erased state, and programmed states P1-P7. A QLC stores 4 bits of data and has 16 logic states, logic {1111, 1110, 1101, 1100, 1011, 1010, 1001, 1000, 0111, 0110, 0101, 0100, 0011, 0010, 0001, 0000}, i.e., erased state and programmed states P1-P15.

As shown in FIG. 1, memory cells 106 in a column of the memory array 101 can be coupled to a source select gate (SSG) transistor 110 at its source end, and a drain select gate (DSG) transistor 112 at its drain end. The SSG transistor 110 and the DSG transistor 112 can be configured to activate selected columns of the memory array 101 during read and program operations. In some implementations, sources of the SSG transistors in the same memory block 104 are coupled through a same source line 114. The drain of each DSG transistor is coupled to a respective bit line 116. From the bit line 116, data can be read from, or written to memory cells in the column of memory array 101. In some implementations, each column of the memory array 101 is configured to be selected or deselected by applying a DSG select voltage or a DSG unselect voltage to the gate of the respective DSG transistor 112 through one or more DSG lines 113, and/or by applying a select voltage or a unselect voltage to the gate of the respective SSG transistor 110 through one or more SSG lines 115.

In some implementations, memory cells of adjacent columns can be coupled through word lines 118. The word line 118 can select which row of the memory array 101 is affected by read and program operations. Each word line 118 can include a gate line coupled to a plurality of control gates (gate electrodes) of a plurality of memory cells 106. Example word lines shown in FIG. 1 include WL0, WL1, WL2, WL3, WL4, and WL5 that are between DSG line 113 and SSG line 115. In some implementations, the word lines can further include dummy word lines coupled to dummy memory cells.

In some implementations, the memory array 101 can include a plurality of memory blocks 104. Each memory block 104 can serve as a basic data unit for erase operations, such that memory cells 106 in the same memory block 104 are erased at the same time. To erase memory cells 106 in a selected memory block 104, the source line 114 coupled to the selected memory block 104 and unselected memory blocks in the same plane can be biased with an erase voltage. For example, the erase voltage can be a high positive voltage (e.g., 20 V or more). In some implementations, an erase operation can be performed at a half-memory block level, a quarter-memory block level, or a level having any suitable number of memory blocks or fractions of a memory block.

Peripheral circuits 102 can be coupled to memory array 101 through bit lines 116, word lines 118, source lines 114, SSG lines 115, and DSG lines 113. Peripheral circuits 102 can include any suitable analog, digital, and mixed-signal circuits for facilitating the operations of memory array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies.

Figure 2:
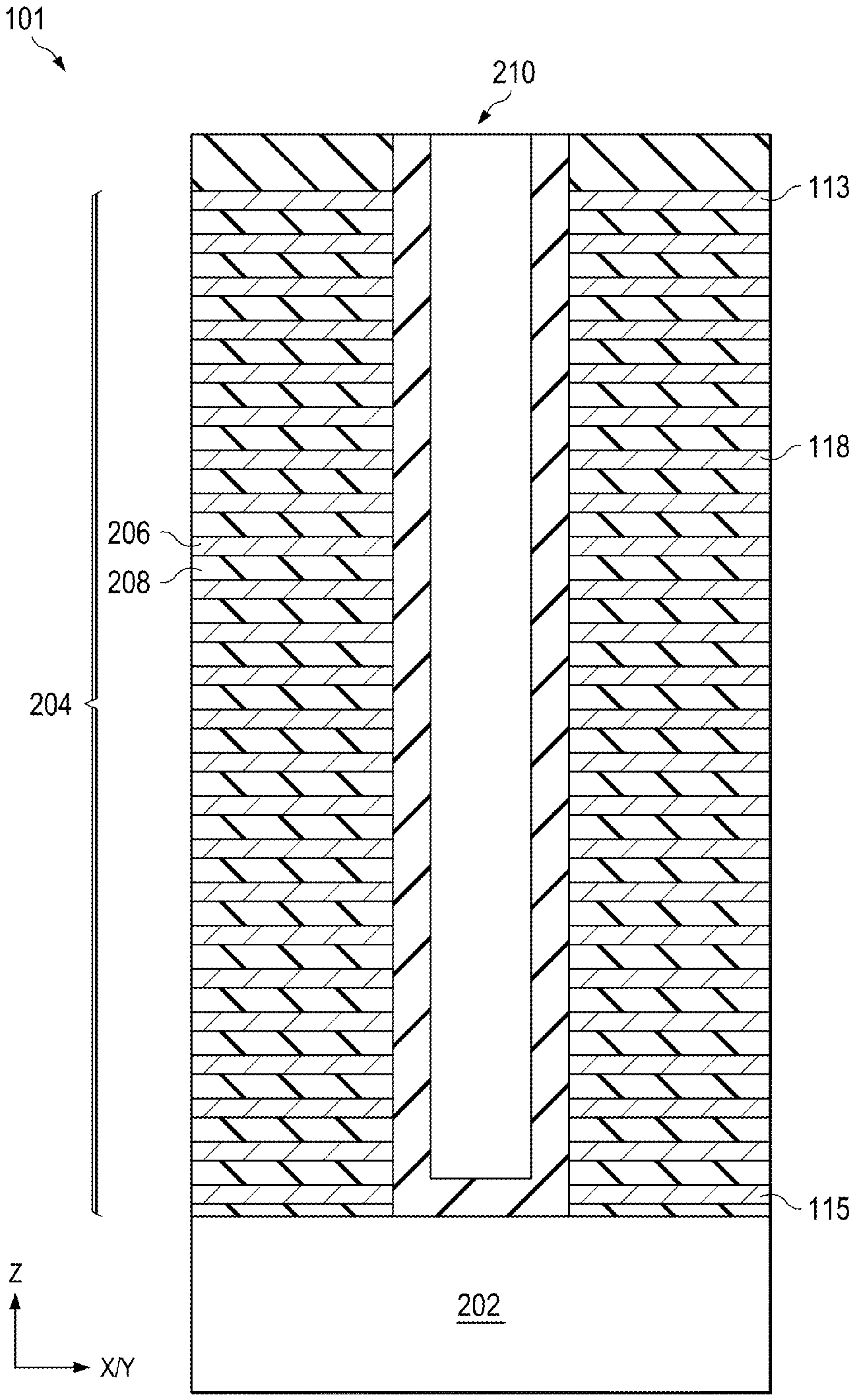
FIG. 2 illustrates an example of a side view of cross-sections of a memory array, according to some aspects of the present disclosure.

FIG. 2 illustrates an example of a side view of cross-sections of a memory array 101, according to some aspects of the present disclosure. As shown in FIG. 2, memory cells 106 in a column of memory array 101 can be coupled in series and extend vertically through a memory stack 204 above a substrate 202. The substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 204 can include pairs of interleaved gate conductive layers 206 and gate-to-gate dielectric layers 208. The quantity of the pairs of the interleaved gate conductive layers 206 and gate-to-gate dielectric layers 208 in a memory stack 204 can determine the quantity of memory cells 106 in the memory array 101. The gate conductive layer 206 can include conductive materials including, but not limited to, one or more of tungsten (W), cobalt (Co), copper (Cu), aluminum (Al), polysilicon, doped silicon, or silicide. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, the DSG transistor 112, or the SSG transistor 110, and can extend laterally as the DSG line 113 at the top of memory stack 204, the SSG line 115 at the bottom of memory stack 204, or the word lines 118 between the DSG line 113 and the SSG line 115. The memory stack 204 can include one or more channel structures 210 that extend vertically through the pairs of interleaved gate conductive layers 206 and gate-to-gate dielectric layers 208. The channel structure 210 can include semiconductor materials including, but not limited to polysilicon. In some implementations, the channel structure 210 can have a cylinder shape, such that a cross section of the channel structure 210 in the xy plane can have a circle shape.

Figure 3:
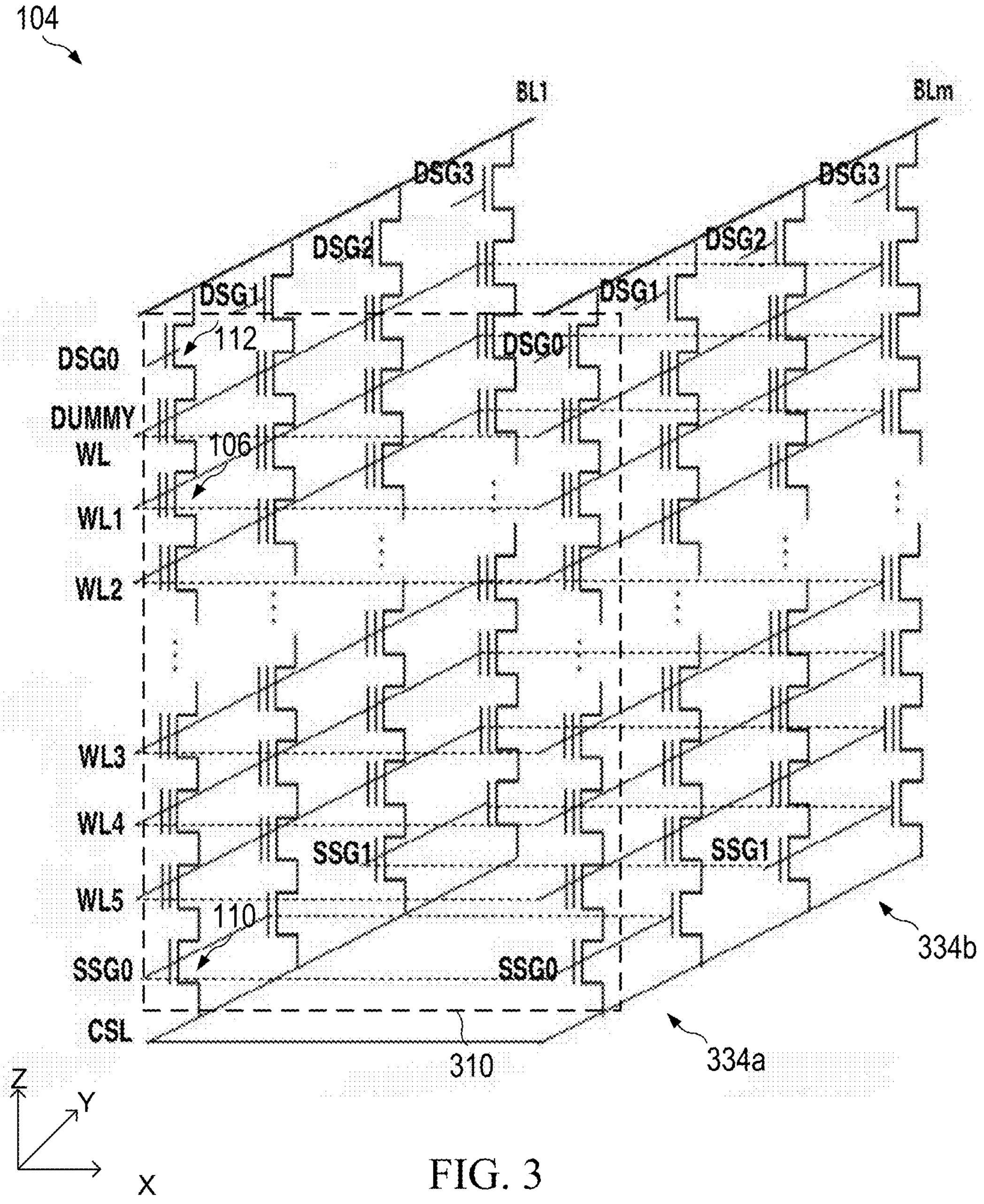
FIG. 3 illustrates an example of a schematic diagram of a memory block including strings, according to some aspects of the present disclosure.

FIG. 3 illustrates an example of a schematic diagram of a memory block 104 including string 310, according to some aspects of the present disclosure. In some implementations, the memory block 104 can include a plurality of strings 310. Each string 310 can include memory cells 106 arranged in rows (e.g., coupled to word lines along x direction) and in columns (e.g., connected in series along z direction). DSG transistors 112 of the same string 310 are coupled to the same DSG line (e.g., DSG line 113 of FIG. 1). DSG lines of different strings 310 are separate from each other by DSG cuts (e.g., DSG cut 404 of FIG. 4), so that each string 310 in the memory block 104 can be selected or deselected by applying a select voltage or an unselect voltage to the respective DSG line. For example, DSG transistors 112 of a first string in the memory block 104 are coupled to a first DSG line represented by DSG0; DSG transistors 112 of a second string in the memory block 104 are coupled to a second DSG line represented by DSG1; DSG transistors 112 of a third string in the memory block 104 are coupled to a third DSG line represented by DSG2; and DSG transistors 112 of a fourth string in the memory block 104 are coupled to a fourth DSG line represented by DSG3.

In some implementations, memory cells 106 in adjacent strings 310 can be coupled through word lines. Example word lines shown in FIG. 4 include Dummy WL, WL1, WL2, WL3, WL4, and WL5. For example, memory cells 106 of the same vertical position (e.g., along z direction) in adjacent strings 310 are coupled to the same word line.

In some implementations, memory block 104 can be divided into fingers 334*a*, 334*b* (collectively as 334). Each finger 334 can include one or more strings 310. SSG transistors 110 of strings 310 in the same finger 334 are coupled to the same SSG line (e.g., SSG line 115 of FIG. 1), so that each finger 334 can be selected or deselected by applying a select voltage or an unselect voltage to the respective SSG line 115. SSG lines of different fingers 334 are separate from each other by SSG cuts (e.g. SSG cut 406 of FIG. 4). For example, SSG transistors 110 of strings 310 in the first finger 334*a* are coupled to a first SSG line represented by SSG0; SSG transistors 110 of strings 310 of the second finger 334*b* are coupled to a second SSG line represented by SSG1.

In some implementations, the memory block 104 can include a different number of fingers 334, and each finger 334 can include a different number of strings 310. In some implementations, the strings 310 are not arranged into fingers 334, for example, by coupling SSG transistors of all strings 310 of the memory block 104 to the same SSG line. As such, by applying select or unselect voltage to the SSG line in the memory block 104, the entire memory block 104 can be selected or deselected.

Figure 4:
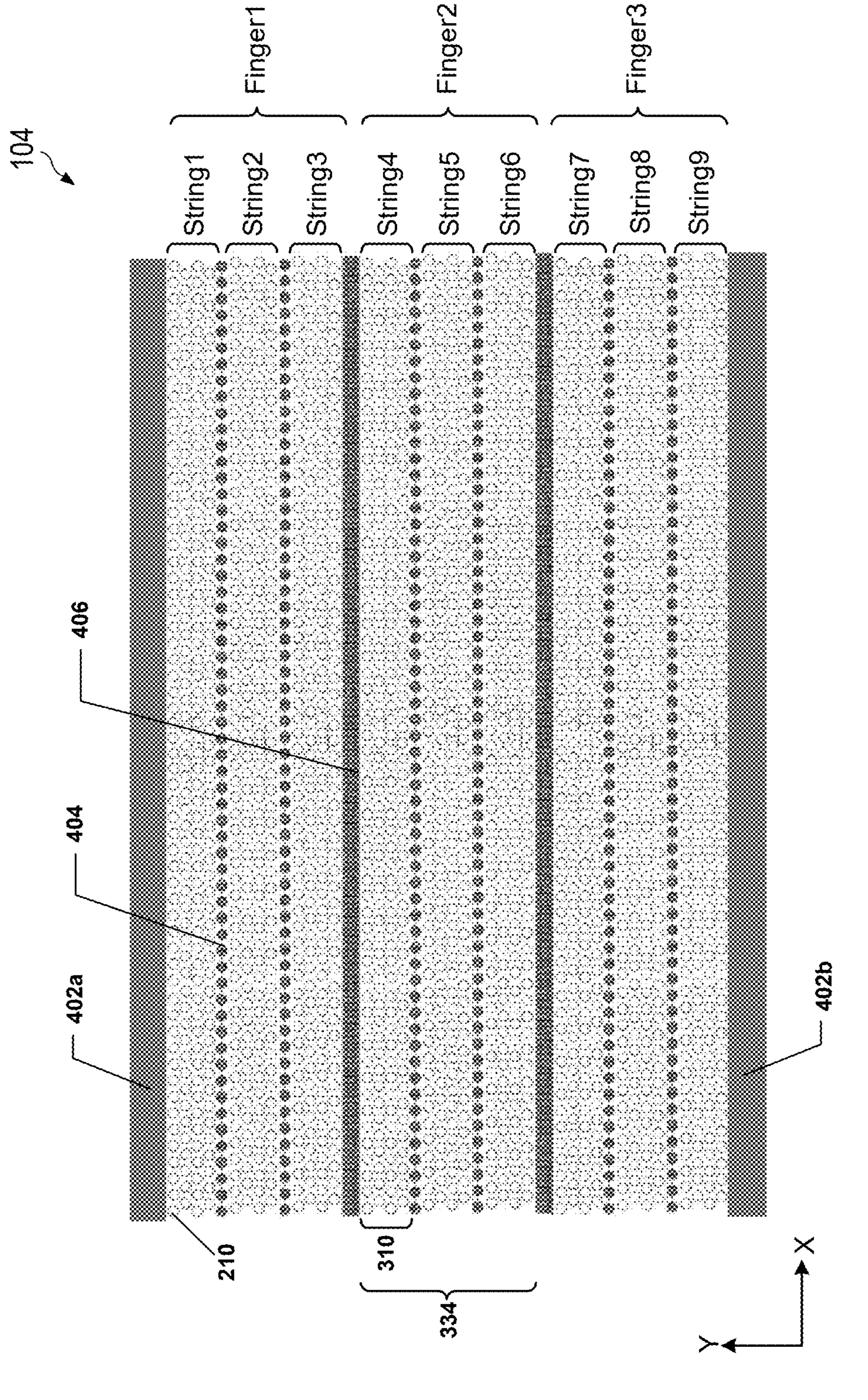
FIG. 4 illustrates an example of a plan view of cross-sections of a memory block including strings, according to some aspects of the present disclosure.

FIG. 4 illustrates an example of a plan view of cross-sections of a memory block 104 including strings 310, according to some aspects of the present disclosure. In some implementations, the memory block 104 is separated from adjacent memory blocks (not shown in FIG. 4) by gate line slit structures 402*a*, 402*b*. For example, the gate line slit structure 402*a* can be a first boundary of the memory block 104, and the gate line slit structure 402*b* can be a second boundary of the memory block 104.

In some implementations, the memory block 104 can include a plurality of strings 310. Each string 310 can include a plurality of channel structures 210 that extend vertically to connect a series of memory cells. The channel structures 210 are arranged in rows along x direction. In some implementations, each string 310 can include more than one row of channel structures 210.

Figure 5:
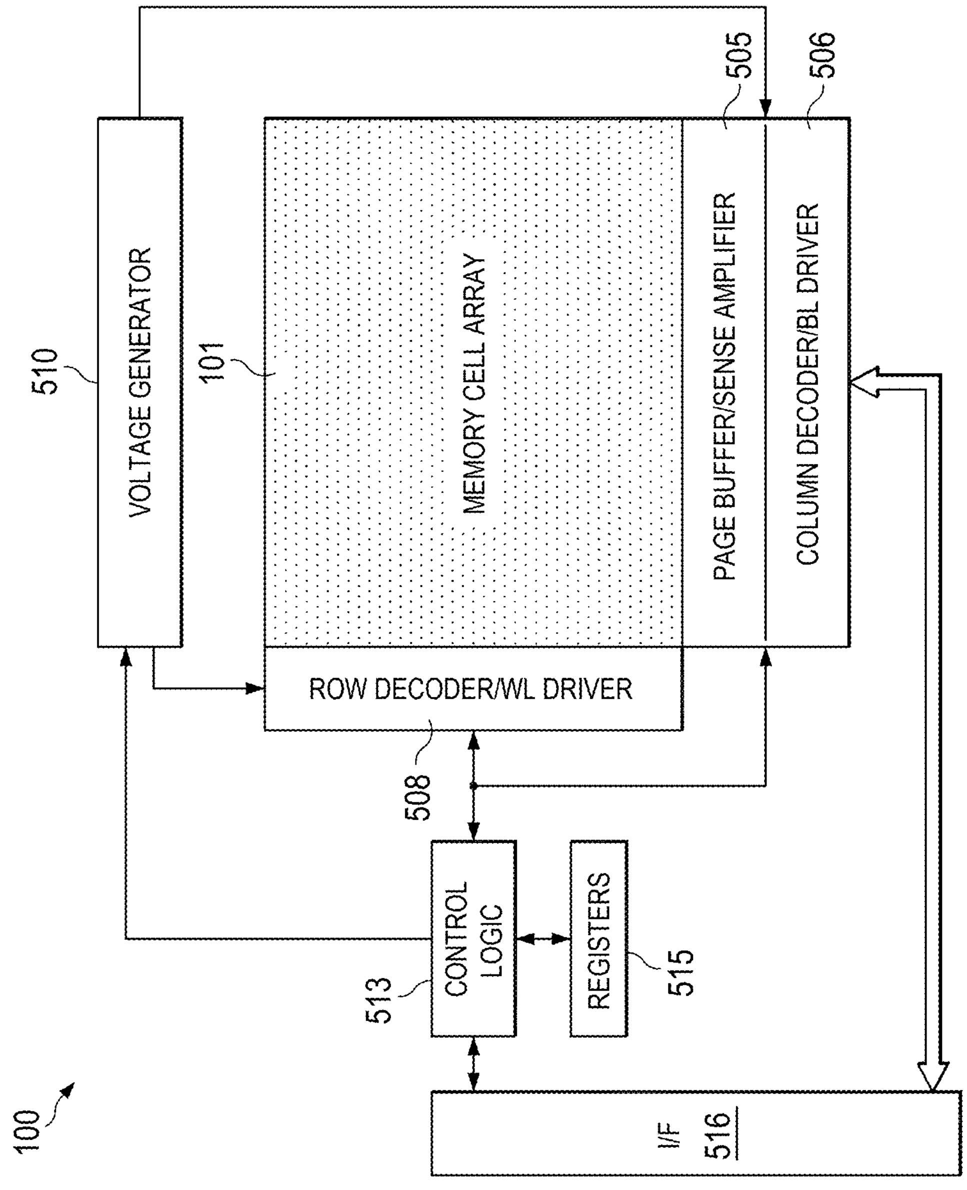
FIG. 5 illustrates some example peripheral circuits, according to some aspects of the present disclosure.

The strings 310 are separated from each other by DSG cuts 404, which can electrically separate DSG lines 113 of different strings 310. As such, each string 310 can be individually selected or deselected by applying DSG voltages to respective DSG line 113. In some implementations, each DSG cut 404 is arranged between two rows of channel structures 210, as shown in FIG. 4. In some other implementations, each DSG cut 404 is arranged on a row of channel structures 210, as shown in FIG. 5.

In some implementations, the strings 310 can be arranged into fingers 334. The fingers are separated from each other by SSG cuts 406, which can electrically separate SSG lines 115 of different fingers 334. As such, each finger 334 can be individually selected or deselected by applying SSG voltage to respective SSG lines 115.

As an example shown in FIG. 4, the memory block 104 includes three fingers 334 separated by SSG cuts 406, and each finger 334 includes three strings 310 separated by DSG cuts 404. For instance, a first finger (Finger1) includes String1-3, a second finger (Finger2) includes String4-6, and a third finger (Finger3) includes String7-9. In some implementations, the memory block 104 can include a different number of fingers 334, and each finger 334 can include a different number of strings 310.

In some implementations, the memory block 104 is not divided into fingers 334, such that SSG lines 115 of all strings 310 in the same memory block 104 are electrically connected, without having SSG cuts 406.

FIG. 5 illustrates some example peripheral circuits, according to some aspects of the present disclosure. The example peripheral circuits include a page buffer/sense amplifier 504, a column decoder/bit line driver 506, a row decoder/word line driver 508, a voltage generator 510, control logic 512, registers 514, an interface 516, and a data bus. In some examples, additional peripheral circuits not shown in FIG. 5 may be included as well.

The page buffer/sense amplifier 504 can be configured to read and program (write) data from and to memory array 101 according to the control signals from control logic 512. In an example, the page buffer/sense amplifier 504 may store one page of program data (write data) to be programmed into one page of the memory array 101. In another example, the page buffer/sense amplifier 504 may perform program verification operations to ensure that the data has been properly programmed into memory cells 106 coupled to selected word lines 118. In still another example, the page buffer/sense amplifier 504 may also sense the low power signals from the bit line 116 that represents a data bit stored in memory cell 106, and amplify the small voltage swing to recognizable logic levels in a read operation. The column decoder/bit line driver 506 can be configured to be controlled by the control logic 512 and select one or more strings 310 by applying bit line voltages generated from the voltage generator 510.

The row decoder/word line driver 508 can be configured to be controlled by the control logic 512 and select/unselect memory blocks 104 of the memory array 101 and select/unselect word lines 118 of the memory block 104. The row decoder/word line driver 508 can be further configured to drive word lines 118 using word line voltages generated from the voltage generator 510. In some implementations, the row decoder/word line driver 508 can also select/unselect and drive SSG lines 115 and DSG lines 113. As described below in detail, the row decoder/word line driver 508 is configured to apply a program voltage to selected word line 118 in a program operation on memory cell 106 coupled to selected word line 118.

The voltage generator 510 can be configured to be controlled by the control logic 512 and generate the word line voltages (e.g., read voltage, program voltage, pass voltage, local voltage, verify voltage, etc.), bit line voltages, and source line voltages to be supplied to the memory array 101.

The control logic 512 can be coupled to each peripheral circuit described above and configured to control operations of each peripheral circuit. The registers 514 can be coupled to the control logic 512 and include status registers, command registers, and address registers for storing status information, command operation codes (OP codes), and command addresses for controlling the operations of each peripheral circuit.

The interface 516 can be coupled to the control logic 512 and act as a control buffer to buffer and relay control commands received from a host (not shown) to the control logic 512 and status information received from the control logic 512 to the host. The interface 516 can also be coupled to the column decoder/bit line driver 506 via a data bus, and act as a data input/output (I/O) interface and a data buffer to buffer and relay data to and from the memory array 101.

Figure 6A:
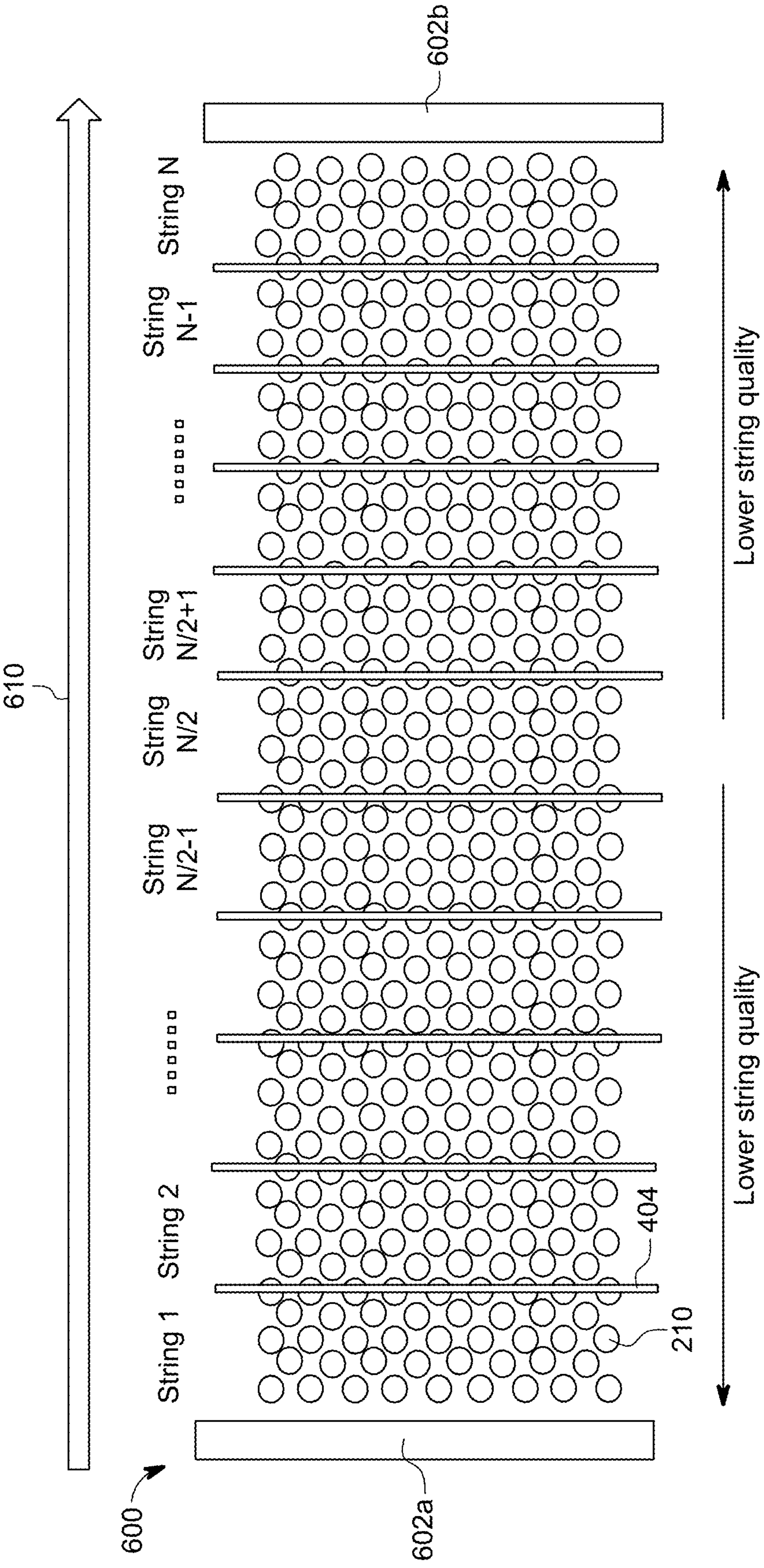
FIG. 6A illustrates an example process of programming a memory block, according to some aspects of the present disclosure.

FIG. 6A illustrates a process of programming a memory block 600 (e.g., the memory block 104 of FIGS. 1 and 3-4) of a memory device (e.g., the memory device 100 of FIGS. 1 and 5), according to some aspects of the present disclosure. The memory block 600 includes a set of N strings (e.g., string 310 of FIGS. 3-4) numbered in sequence from 1 to N, from a first boundary 602*a* (e.g., the gate line slit structure 402*a*) of the memory block 600 to a second boundary 602*b* (e.g., the gate line slit structure 402*b*), where N is a positive integer.

In some implementations, due to the fabrication process, strings at different positions in the memory block 600 can have different levels of quality. For example, a string (e.g., String1 or StringN, each referred to as an outer string) that is closer to the boundaries 602 of the memory block 600 has lower quality and is less reliable than a string (e.g., $$\text{String}\frac{N}{2}$$

when N is an even number, or $$\text{String}\left(\frac{N+1}{2}\right)$$

when N is an odd number, each referred to as an inner string) that is further away from the boundaries 602. For instance, the channel structures 210 of the outer string are smaller in size (e.g., have a smaller diameter when measured from a same layer) than the channel structures 210 of the inner string, and/or the channel structures 210 of the outer string are not as uniformly round as the channel structures 210 of the inner string.

In some implementations, at or near a same layer of the memory stack (e.g., the memory stack 204 of FIG. 2 of a memory block), the diameter of the channel structures of the outer string may be smaller than the diameter of the channel structures of the inner string. For example, the diameter of the channel structures of the outer string measured at or near the surface layer of the memory stack may be smaller than the diameter of the channel structures of the inner string measured at or near the surface layer of the memory stack, and/or the diameter of the channel structures of the outer string measured at or near the bottom layer of the memory stack may be smaller than the diameter of the channel structures of the inner string measured at or near the bottom layer of the memory stack.

In some implementations, the diameter of a channel structure may change along a vertical direction (e.g., decreases from the surface layer of the memory stack to the bottom layer of the memory stack). In some instances, when measured at different layers, the diameter of the channel structures of the outer string measured at or near the surface layer of the memory stack may be greater than the diameter of the channel structures of the inner string measured at or near the bottom layer and/or at an intermediate layer (e.g., a gate conductive layer 206 or a gate-to-gate dielectric layer 208 of FIG. 2) between the surface layer and the bottom layer of the memory stack.

In some implementations, the quality of the channel structures 210 in the memory block decreases from the inner string to the outer strings. A string of lower quality can have a narrower read window than a string of higher quality.

In some implementations, during the process of programming the memory block 600, the set of strings are programmed following a sequence that starts from a string that is closest to one boundary 602, and ends with a string that is closest to the other boundary 602. For example, the memory block 600 is programmed by programming according to a sequence, String1, String2, . . . , StringN−1, and StringN, as indicated by arrow 610. For another example, the memory block is programmed by programming, in sequence, StringN, StringN-1, . . . , String2, and String1.

In some implementations, the string that is programmed earlier is affected more by program disturbance than the string that is programmed later. For example, threshold voltages of the memory cells in a programmed string may shift due to the program pulses applied to other strings. As a result, the read window of the string that is programmed earlier may be narrower than the read window of the string that is programmed later.

Figure 6B:
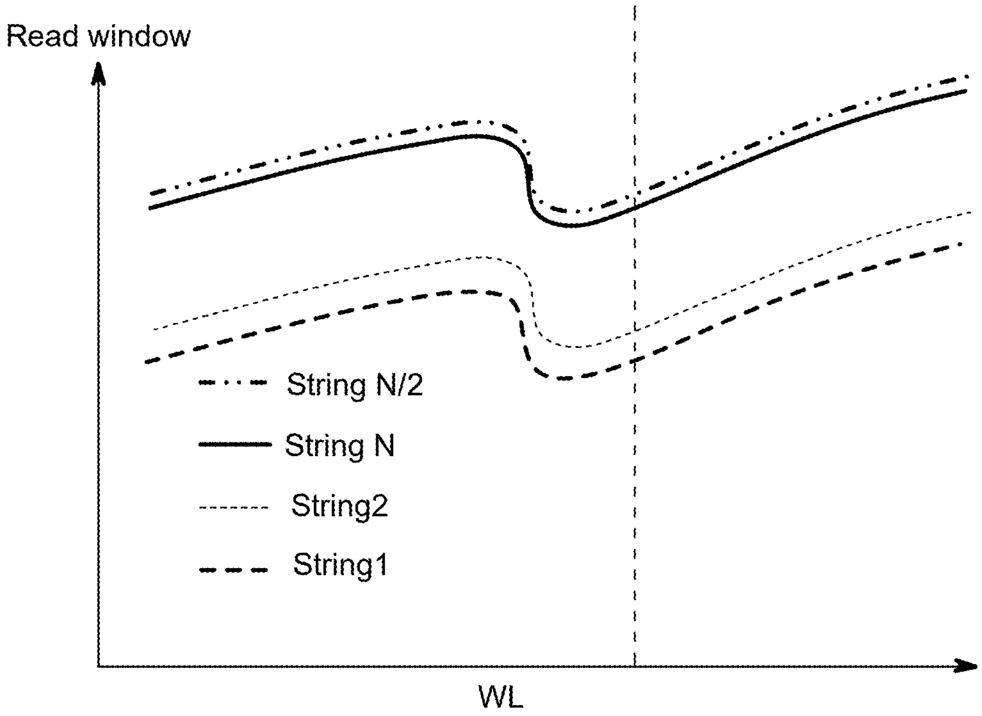
FIG. 6B illustrates read windows of different strings after programming a memory block using the process as shown in FIG. 6A, according to some aspects of the present disclosure.

FIG. 6B illustrates read windows of the set of strings after programming the memory block 600 using the process shown in FIG. 6A (e.g., programming from String1 to StringN), according to some aspects of the present disclosure. The read window of a string represents a sum of voltage intervals among threshold voltage distributions corresponding to different data states (e.g., erase state and programmed states P1-P7 of a TLC, or erase state and programmed states P1-P15 of a QLC). A string having a narrower read window can be more susceptible to read failure, compared to a string having a wider read window.

As shown in FIG. 6B, by comparing memory cells coupled to the same word line, the read window of an outer string (e.g., String1, which is of lower quality and is programmed first) can have the narrowest read window, and the inner string (e.g., StringN/2, which is of higher quality and is programmed in the middle) can have the widest read window. The read window of other strings, including the other outer string (e.g., StringN, which is of lower quality and is programmed last), can be between the narrowest read window and the widest read window. In some cases, by using the process shown in FIG. 6A to program the memory block 600, the difference between the narrowest read window and the largest read window can be large.

Figure 7A:
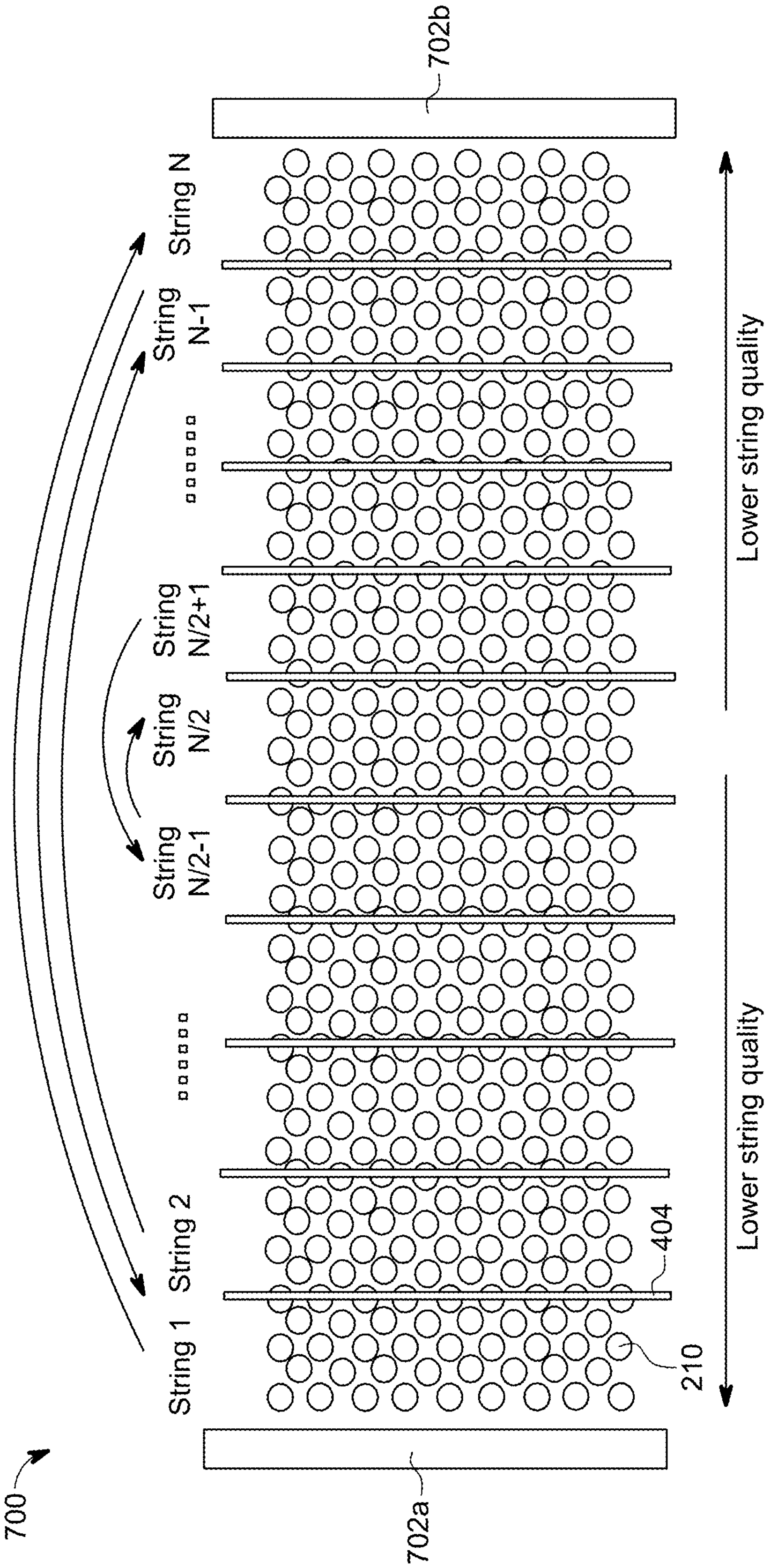
FIG. 7A illustrates another example process of programming a memory block, according to some aspects of the present disclosure.

FIG. 7A illustrates another process of programming a memory block 700 (e.g., the memory block 104 of FIGS. 1 and 3-4) of a memory device (e.g., the memory device 100 of FIGS. 1 and 5), according to some aspects of the present disclosure. Similar to FIG. 6A, the memory block 700 includes a set of N strings (e.g., string 310 of FIGS. 3-4) numbered in sequence from 1 to N, from a first boundary 702*a* (e.g., the gate line slit structure 402*a*) of the memory block 700 to a second boundary 702*b* (e.g., the gate line slit structure 402*b*), where N is a positive integer. The quality of the channel structures 210 in the memory block 700 decreases from the inner string (e.g., $$\text{String}\frac{N}{2}$$

when N is an even number, or String $$\text{String}\left(\frac{N+1}{2}\right)$$

(when N is an odd number,) to the outer strings (e.g., String1 and StringN).

In some implementations, during the process of programming the memory block 700, the set of strings are programmed following a sequence that starts from the inner string and ends with the outer strings. A string closer to the inner string is programmed earlier than a string further away from the inner string. For example, when N is an even number, the memory block 700 is programmed by programming according to a sequence, $$\text{String}\frac{N}{2},$$

$$\text{String}\frac{N}{2}+1,\ \text{String}\frac{N}{2}-1,\ \ldots,$$

String2, StringN−1, String1, and StringN. As an example, if a memory block 700 has a set of 6 strings numbered from 1 to 6 from the first boundary 702*a* to the second boundary 702*b*, the memory block 700 can be programmed by programming, in sequence, String3, String4, String2, String5, String1 and String6. When N is an odd number, the memory block 700 is programmed by programming, in sequence, $$\text{String}\frac{N+1}{2},\ \text{String}\frac{N-1}{2},\ \text{String}\frac{N+1}{2}+1,\ \ldots,$$

String2, StringN−1, String1, and StringN. As an example, if a memory block 700 has a set of 7 strings numbered from 1 to 7 from the first boundary 702*a* to the second boundary 702*b*, the memory block 700 can be programmed by programming, in sequence, String4, String3, String5, String2, String6, String1, and String7.

Figure 7B:
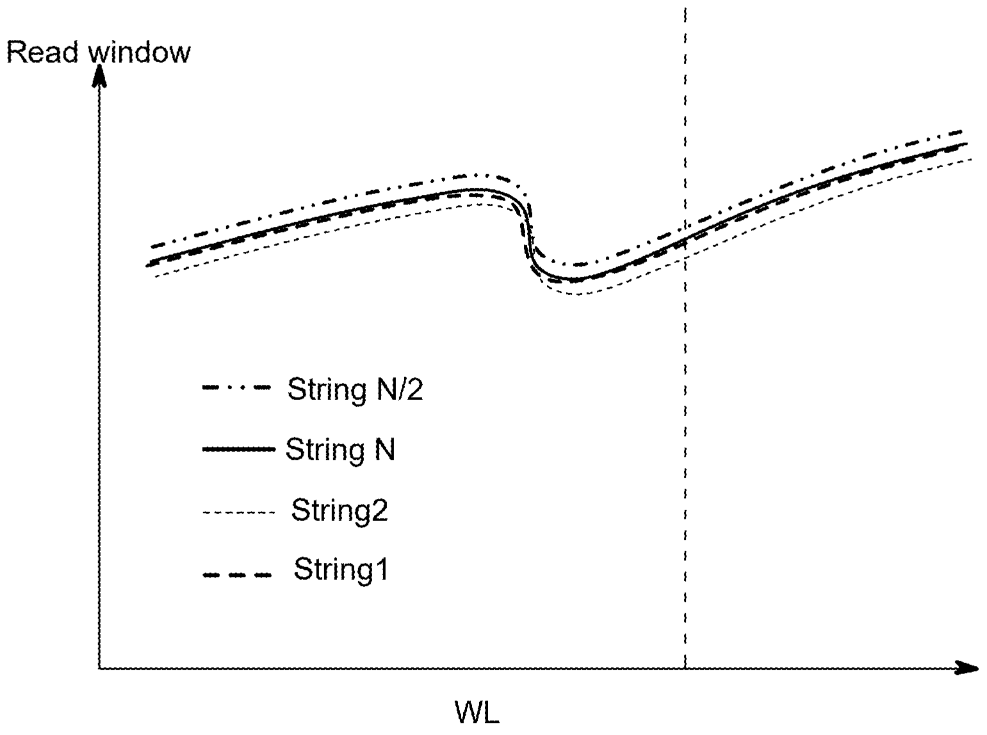
FIG. 7B illustrates read windows of different strings after programming a memory block using the process as shown in FIG. 7A, according to some aspects of the present disclosure.

FIG. 7B illustrates read windows of the set of strings after programming the memory block 700 using the process shown in FIG. 7A (e.g., programming from the inner string to the outer strings), according to some aspects of the present disclosure.

By using the process shown in FIG. 7A, the string of higher quality is programmed earlier and is therefore affected more by program disturbance, while the string of lower quality is programmed later and is therefore affected less by program disturbance. As such, read windows of different strings in the memory block 700 are more uniform, compared to the scenarios where the memory block 600 is programmed using the process shown in FIG. 6A. For example, as shown in FIG. 7B, by comparing memory cells coupled to the same word line, the read window of the inner string (e.g., $$\text{String}\frac{N}{2}$$

) and the read window of the outer strings (e.g., String1 and StringN) are close to each other. The read windows of the outer strings are wider in FIG. 7B, compared to the read windows of the outer strings in FIG. 6B. As such, the outer strings are less susceptible to read failure. In some cases, after programming the outer strings, due to program disturbance, the read window of the inner string can be narrower than the read window of the outer strings.

Figure 8:
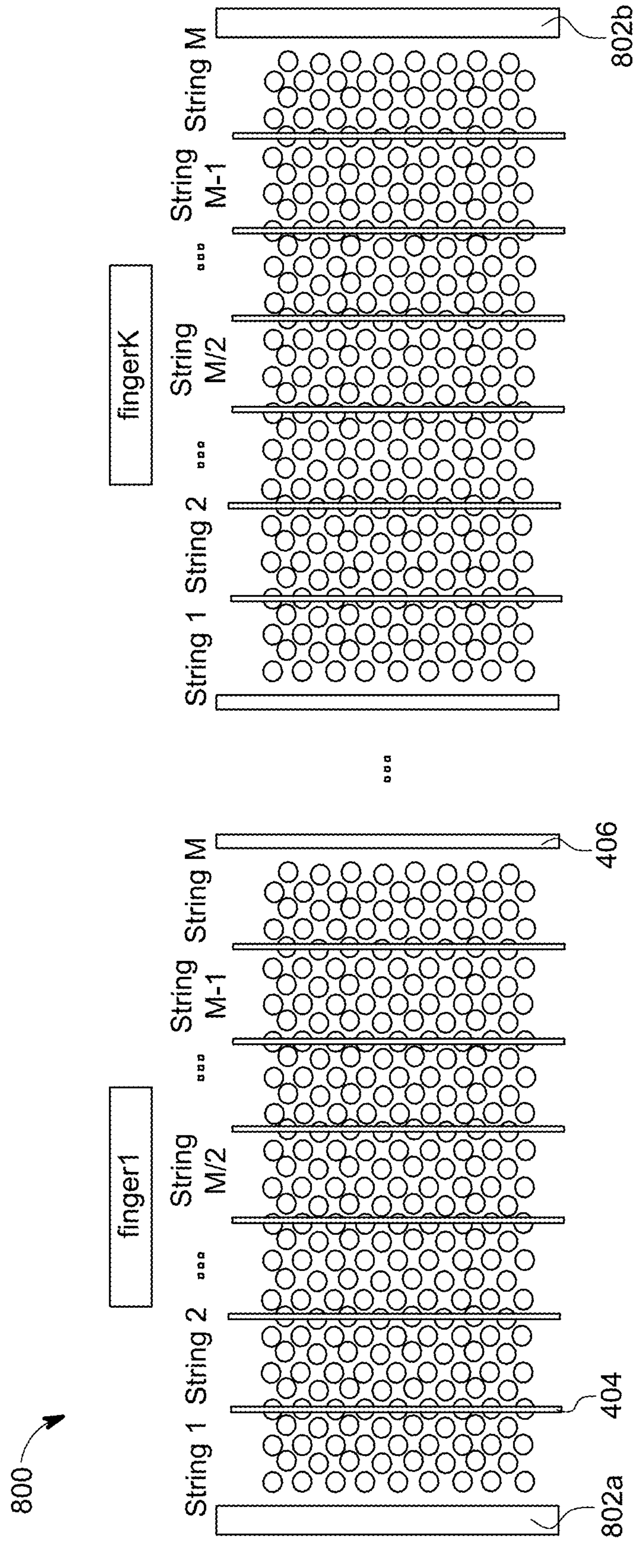
FIGS. 8-9 illustrate an example process of programming a memory block including fingers, according to some aspects of the present disclosure.

FIG. 8 illustrates a process to program a memory block 800 (e.g., the memory block 104 of FIGS. 3-4) that includes a plurality of fingers (e.g., finger 334 of FIGS. 3-4), according to some aspects of the present disclosure.

The memory block includes K fingers numbered in sequence from 1 to K, from a first boundary 802*a* (e.g., the gate line slit structure 402*a*) of the memory block 800 to a second boundary 802*b* (e.g., the gate line slit structure 402*b*), where K is a positive integer. The fingers are separated from each other by SSG cuts 406. Each finger can include M strings numbered from 1 to M, from a first boundary (e.g., a SSG cut 406) of the finger to a second boundary (e.g., a SSG cut 406) of the finger, where M is a positive integer.

Within each finger, a string (e.g., $$\text{String}\frac{M}{2}$$

when M is an even number, or $$\text{String}\frac{M+1}{2}$$

when M is an odd number) further away from the boundaries of the finger can be an inner string of the finger, and a string (e.g., String1 or StringM) closer to the boundaries of the finger can be an outer string of the finger.

Figure 9:
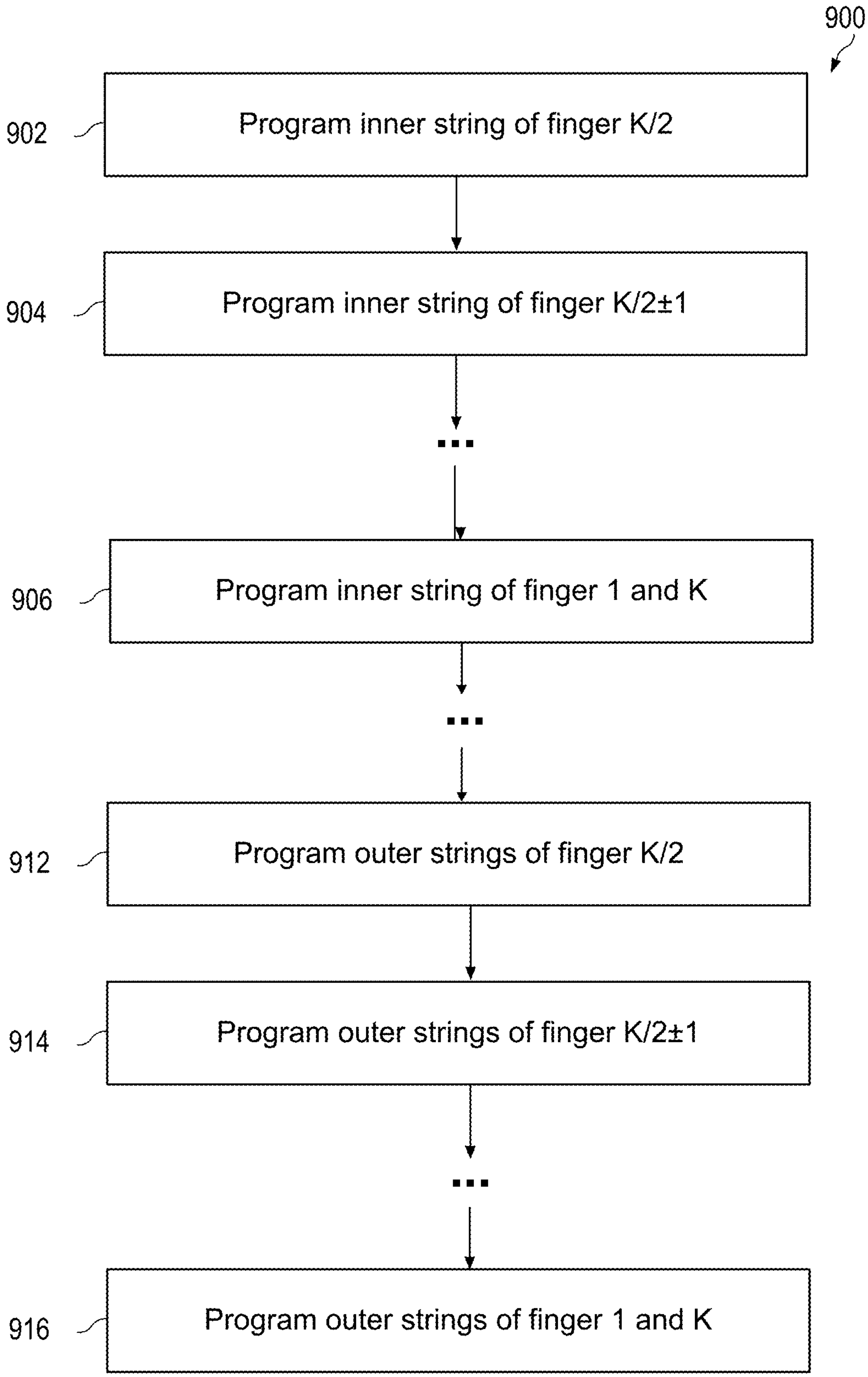

In some implementations, strings in a finger (e.g., $$\text{Finger}\frac{K}{2}$$

when K is an even number, or $$\text{Finger}\frac{K+1}{2}$$

when K is an odd number, referred to as an inner finger) that is further away from the boundaries 802 of the memory block 800 can be programmed earlier than strings in a finger (e.g., Finger1 or FingerK, each referred to as an outer finger) that is closer to the boundaries 802 of the memory block 800. In some implementations, as shown in FIG. 9, the memory block can be programmed by programming inner strings of all fingers first, and programming outer strings of all fingers last.

For example, at 902, the inner string of the inner finger (e.g., $$\text{Finger}\frac{K}{2}$$

) is programmed first. At 904, the inner string of a finger $$\text{(e.g.., Finger}\frac{K}{2}+1)$$

adjacent to the inner finger is programmed. After 904 and before 906, the inner string of each of the other fingers (except Finger1 and FingerK) is programmed, following the sequence of $$\text{Finger}\frac{K}{2}-1,\ \text{Finger}\frac{K}{2}+2,\ \text{Finger}\frac{K}{2}-2,$$

and so on. At 906, the inner string of the outer fingers (e.g., Finger1 and FingerK) are programmed. After 906 and before 912, the other strings (except the outer strings) in each finger are programmed following the same approach. At 912, the outer strings of the inner finger are programmed. At 914, the outer strings of the finger adjacent to the inner finger are programmed. After 914 and before 916, the outer strings of each of the other fingers (except Finger1 and FingerK) are programmed, following the sequence of $$\text{Finger}\frac{K}{2}-1,\ \text{Finger}\frac{K}{2}+2,\ \text{Finger}\frac{K}{2}-2,$$

and so on. At 916, the outer strings of the outer fingers (e.g., Finger1 and FingerK) are programmed last.

As one example, with reference to FIG. 4, the memory block 104 can be programmed by programming, in sequence, String5, String2, String8, String4, String1, String7, String6, String3, and String9.

In some implementations, the fingers are programmed in sequence from Finger1 to FingerK, while the strings within each finger are programmed from an inner string to the outer strings. For example, Finger1 is programmed first by programming, in sequence, $$\text{String}\frac{M}{2},$$

$$\text{String}\frac{M}{2}+1, \text{String}\frac{M}{2}-1, \ldots,$$

String1, StringM of Finger1. FingerK is programmed last by programming, in sequence, $$\text{String}\frac{M}{2},$$

$$\text{String}\frac{M}{2}+1, \text{String}\frac{M}{2}-1, \ldots,$$

String1, StringM of FingerK. As one example, with reference to FIG. 4, the memory block 104 can be programmed by programming, in sequence, String2, String1, String3, String5, String4, String6, String8, String7 and String9.

In some implementations, the fingers are programmed in sequence from the inner finger to outer fingers, while the strings within each finger are programmed from the first boundary of the finger to the second boundary of the finger. For example, $$\text{Finger}\frac{K}{2}$$

is programmed first, by programming, in sequence, String1, String2, . . . , StringM−1, String M of $$\text{Finger}\frac{K}{2}.$$

Finger 1 and Finger K are programmed last by programming, in sequence, String1, String2, . . . , StringM−1, String M of each of Finger1 and FingerK. As one example, with reference to FIG. 4, the memory block 104 can be programmed by programming, in sequence, String5, String4, String6, String2, String1, String3, String8, String7 and String9.

In some implementations, the memory block 800 including a plurality of fingers can be programmed following a different order or approach, so that at least one string of lower quality can be programmed later than a string of higher quality.

Figure 10:
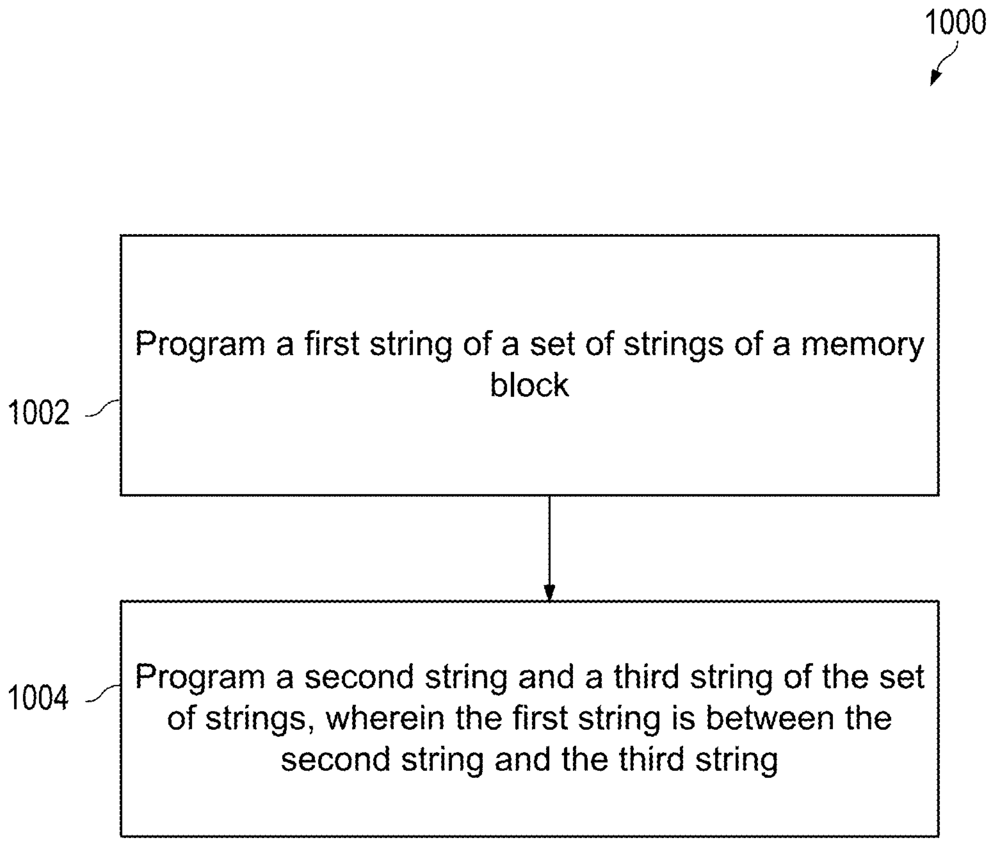
FIG. 10 illustrates an example of a flow chart of a method for programming a memory block in a memory device, according to some aspects of the present disclosure.

FIG. 10 illustrates a flow chart of an example process 1000 for programming a memory block in a memory device (e.g., memory device 100 of FIGS. 1 and 5, memory device1104 of FIGS. 11-12B), according to some aspects of the present disclosure. Process 1000 can be performed by any suitable device or system as described herein, for example, according to the example techniques described with respect to FIGS. 1-9. For example, process 1000 can be performed by a memory device, such as the memory device

100 of FIGS. 1 and 5 that includes a memory array 101. The memory array 101 can include one or more memory blocks (e.g., memory block 104 of FIGS. 1 and 3-4, memory block 600 of FIG. 6A, memory block 700 of FIG. 7A, or memory block 800 of FIG. 8) that each include a set of strings (e.g., string 310 of FIGS. 3-4). In some implementations, the memory device can also include peripheral circuits (e.g., peripheral circuits 102 of FIG. 1). The memory device can be a part of a memory system, such as memory system 1102 of FIG. 11.

The operations shown in process 1000 may not be exhaustive and that other operations can be performed as well before, after, or in between any of the illustrated operations. Further, some of the operations may be performed simultaneously, or in a different order than shown in FIG. 10. In some implementations, some of the operations may be performed by or one or more components of a device or a system, such as, a peripheral circuit of the memory device.

At 1002, a first string (e.g., String5 of FIG. 4) of a set of strings (e.g., String1-9 of FIG. 4) of a memory block is programmed. The first string can be an inner string that is further away from the boundaries (e.g., gate line slit structures 402 of FIG. 4) of the memory block than other strings.

At 1004, a second string (e.g., String1 of FIG. 4) and a third string (e.g., String9 of FIG. 4) are programmed after programming the first string. The first string is located between the second string and the third string. The second string and the third string can be outer strings that are closer to the boundaries of the memory block than other strings.

In some implementations, the memory block includes a first finger (e.g., Finger1 of FIG. 4), a second finger (e.g., Finger 2 of FIG. 4) and a third finger (e.g., Finger 3 of FIG. 4) that each include one or more strings. The second finger is located between the first finger and the third finger. The first finger can include a fourth string (e.g., String1 of FIG. 4), a fifth string (e.g., String3 of FIG. 4), and a sixth string (e.g., String2 of FIG. 4) that is between the fourth string and the fifth string. The second finger can include the first string, the second string and the third string. The third finger can include a seventh string (e.g., String 7 of FIG. 4), an eighth string (e.g., String9 of FIG. 4) and a ninth string (e.g., String8 of FIG. 4) that is between the seventh string and the eighth string.

In some implementations, the memory block can be programmed by programming the first string, then programming the sixth string, then programming the ninth string, and then programming the second string.

In some implementations, the memory block can be programmed by programming the sixth string, then programming the fourth string and the fifth string, then programming the first string, then programming the second string and the third string, then programming the ninth string, and then programming the seventh string and the eighth string.

In some implementations, the memory block can be programmed according to another sequence or order by programming at least one inner string earlier than at least one outer string, for example, to reduce the difference in quality (e.g., the size of a read window) of the at least one inner string and the at least one outer string.

Figure 11:
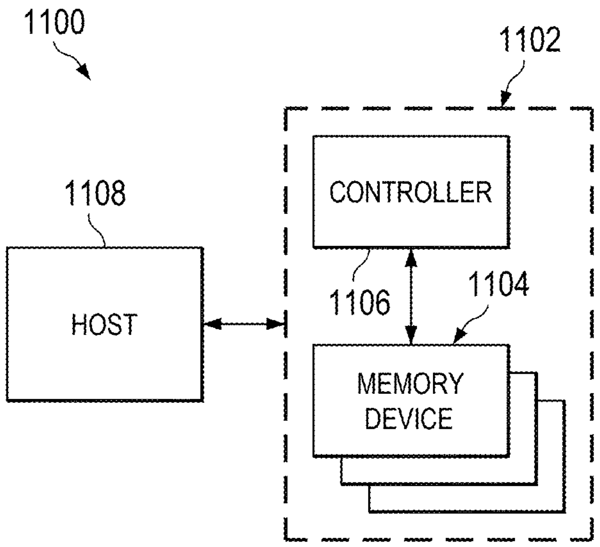
FIG. 11 illustrates a memory block diagram of an example system having a memory device, according to some aspects of the present disclosure.

FIG. 11 illustrates a memory block diagram of an example system 1100 having a memory device, according to some aspects of the present disclosure. System 1100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. System 1100 can include a host 1108 and a memory system 1102 having one or more memory devices 1104 and a memory controller 1106. Host 1108 can be a processor of an electronic device, such as a central processing unit (CPU), or a system-on-chip (SoC), such as an application processor (AP). Host 1108 can be configured to send or receive data to or from memory devices 1104.

Memory device 1104 can be any memory device disclosed in the present disclosure. Memory controller 1106 is coupled to memory device 1104 and host 1108 and is configured to control the memory device 1104, according to some implementations. Memory controller 1106 can manage the data stored in memory device 1104 and communicate with host 1108. In some implementations, memory controller 1106 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1106 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1106 can be configured to control operations of memory device 1104, such as read, erase, and program operations. Memory controller 1106 can also be configured to manage various functions with respect to the data stored or to be stored in memory device 1104 including, but not limited to bad-memory block management, garbage collection, logical-to-physical address conversion, wear leveling, etc. In some implementations, memory controller 1106 is further configured to process error correction codes (ECCs) with respect to the data read from or written to memory device 1104. Any other suitable functions may be performed by memory controller 1106 as well, for example, formatting memory device 1104.

Memory controller 1106 can communicate with an external device (e.g., host 1108) according to a particular communication protocol. For example, memory controller 1106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 12A:
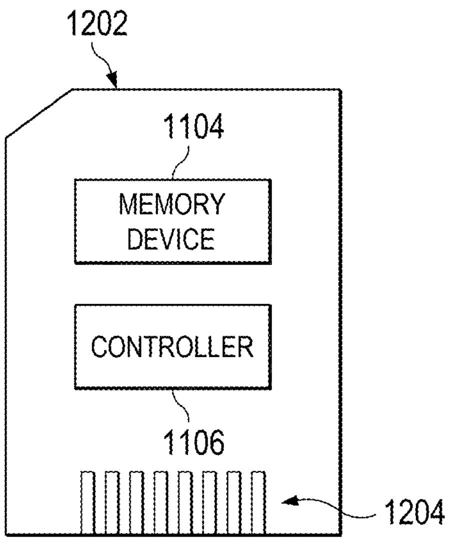
FIG. 12A illustrates a diagram of a memory card having a memory device, according to some aspects of the present disclosure.
Figure 12B:
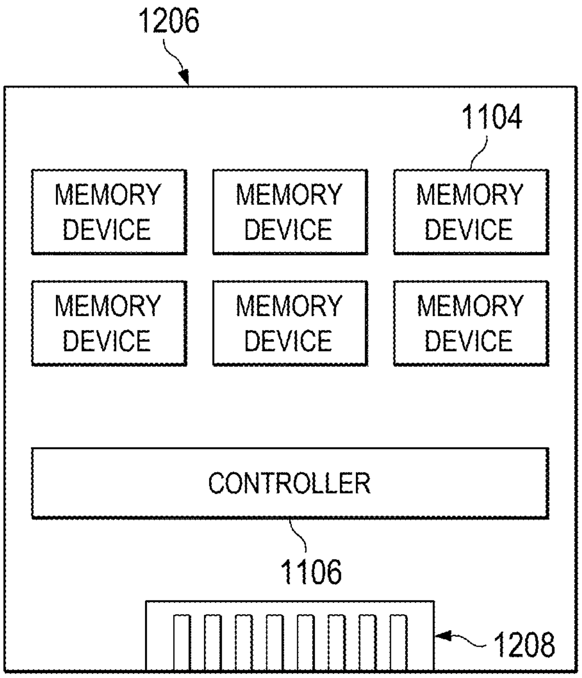
FIG. 12B illustrates a diagram of a solid-state drive (SSD) having a memory device, according to some aspects of the present disclosure.

Memory controller 1106 and one or more memory devices 1104 can be integrated into various types of storage devices. For example, memory controller 1106 and one or more memory devices 1104 can be packaged in a universal Flash storage (UFS) package or an eMMC package. In one example as shown in FIG. 12A, memory controller 1106 and a single memory device 1104 may be integrated into a memory card 1202. Memory card 1202 can include a PC card (PCMCIA, personal computer memory card international association), a CF card, a smart media (SM) card, a memory stick, a multimedia card (MMC, R S-MMC, MMC-micro), an SD card (SD, miniSD, microSD, SDHC), a UFS, etc. Memory card 1202 can further include a memory card connector 1204 coupling memory card 1202 with a host (e.g., host 1108 in FIG. 11). In another example as shown in FIG. 12B, memory controller 1106 and multiple memory devices 1104 may be integrated into an SSD 1206. SSD 1206 can further include an SSD connector 1208 coupling SSD 1206 with a host (e.g., host 1108 in FIG. 11). In some implementations, the storage capacity and/or the operation speed of SSD 1206 is greater than those of memory card 1202.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A memory device, comprising:

a memory array comprising a memory block, wherein the memory block comprises a set of strings; and a peripheral circuit coupled to the memory array and configured to program the memory block, wherein programming the memory block comprises:

after programming a first string of the set of strings, programming a second string and a third string of the set of strings, wherein the first string is between the second string and the third string.

2. The memory device of claim 1, wherein the set of strings comprise N strings numbered in sequence from a first boundary of the memory block to a second boundary of the memory block, wherein programming the memory block comprises the following operations in sequence:

programming the $$\left(\frac{N}{2}\right)^{th}$$

string;

programming the $$\left(\frac{N}{2}+1\right)^{th}$$

string; and programming the $$\left(\frac{N}{2}-1\right)^{th}$$

string, where N is an even number.

3. The memory device of claim 1, wherein the set of strings comprise N strings numbered in sequence from a first boundary of the memory block to a second boundary of the memory block, wherein programming the memory block comprises the following operations in sequence:

programming the $$\left(\frac{N+1}{2}\right)^{th}$$

string;

programming the $$\left(\frac{N-1}{2}\right)^{th}$$

string; and programming the $$\left(\frac{N+1}{2}+1\right)^{th}$$

string, where N is an odd number.

4. The memory device of claim 1, wherein channel structures of the first string are larger in size than channel structures of the second string and the third string.

5. The memory device of claim 1, wherein, after programming the second string and the third string, a read window of the first string is narrower than a read window of the second string or the third string.

6. The memory device of claim 1, wherein the memory block comprises a first finger, a second finger and a third finger each comprising one or more strings of the set of strings, wherein the second finger is between the first finger and the third finger, and wherein the second finger comprises the first string, the second string and the third string.

7. The memory device of claim 6, wherein the first finger comprises a fourth string, a fifth string, and a sixth string that is between the fourth string and the fifth string, wherein the third finger comprises a seventh string, an eighth string, and a ninth string that is between the seventh string and the eighth string, and wherein programming the memory block comprises:

programming the sixth string after programming the first string; and programming the ninth string after programming the sixth string and before programming the second string.

8. The memory device of claim 6, wherein the first finger comprises a fourth string, a fifth string and a sixth string that is between the fourth string and the fifth string, wherein the third finger comprises a seventh string, an eighth string and a ninth string that is between the seventh string and the eighth string, wherein programming the memory block comprises:

programming the sixth string;

programming the fourth string and the fifth string after programming the sixth string and before programming the first string;

programming the ninth string after programming the second string and the third string; and programming the seventh string and the eighth string after programming the ninth string.

9. The memory device of claim 1, wherein each of the set of strings comprises more than one row of channel structures, wherein the set of strings are separated from each other by drain select gate (DSG) cuts.

10. The memory device of claim 9, wherein a DSG cut is arranged on a row of channel structures.

11. The memory device of claim 9, wherein a DSG cut is arranged between two rows of channel structures.

12. The memory device of claim 1, wherein the memory device comprises a NAND memory device, and wherein the memory array comprises memory cells stacked in three dimensions.

13. A method for operating a memory device, comprising:

programming a memory block comprising a set of strings, wherein programming the memory block comprises:

after programming a first string of the set of strings, programming a second string and a third string of the set of strings, wherein the first string is arranged between the second string and the third string.

14. The method of claim 13, wherein the set of strings comprise N strings numbered in sequence from a first boundary of the memory block to a second boundary of the memory block, wherein programming the memory block comprises the following operations in sequence:

programming the $$\left(\frac{N}{2}\right)^{th}$$

string;

programming the $$\left(\frac{N}{2}+1\right)^{th}$$

string; and programming the $$\left(\frac{N}{2}-1\right)^{th}$$

string, where N is an even number.

15. The method of claim 13, wherein the set of strings comprise N strings numbered in sequence from a first boundary of the memory block to a second boundary of the memory block, wherein programming the memory block comprises the following operations in sequence:

programming the $$\left(\frac{N+1}{2}\right)^{th}$$

string;

programming the $$\left(\frac{N-1}{2}\right)^{th}$$

string; and programming the $$\left(\frac{N+1}{2}+1\right)^{th}$$

string, where N is an odd number.

16. The method of claim 13, wherein the memory block comprises a first finger, a second finger and a third finger each comprising one or more strings of the set of strings, wherein the second finger is between the first finger and the third finger, and wherein the second finger comprises the first string, the second string and the third string.

17. The method of claim 16, wherein the first finger comprises a fourth string, a fifth string, and a sixth string that is between the fourth string and the fifth string, wherein the third finger comprises a seventh string, an eighth string, and a ninth string that is between the seventh string and the eighth string, and wherein programming the memory block comprises:

programming the sixth string after programming the first string; and programming the ninth string after programming the sixth string and before programming the second string.

18. The method of claim 16, wherein the first finger comprises a fourth string, a fifth string and a sixth string that is between the fourth string and the fifth string, wherein the third finger comprises a seventh string, an eighth string and a ninth string that is between the seventh string and the eighth string, wherein programming the memory block comprises:

programming the sixth string;

programming the fourth string and the fifth string after programming the sixth string and before programming the first string;

programming the ninth string after programming the second string and the third string; and programming the seventh string and the eighth string after programming the ninth string.

19. The method of claim 13, wherein each of the set of strings comprises more than one row of channel structures, wherein the set of strings are separated from each other by drain select gate (DSG) cuts.

* * * * *